(12) United States Patent
Nomura et al.

(10) Patent No.: US 6,757,304 B1
(45) Date of Patent: Jun. 29, 2004

(54) METHOD AND APPARATUS FOR DATA COMMUNICATION AND STORAGE WHEREIN A IEEE1394/FIREWIRE CLOCK IS SYNCHRONIZED TO AN ATM NETWORK CLOCK

(75) Inventors: Takashi Nomura, Tokyo (JP); Atsushi Maruyama, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/491,280

(22) Filed: Jan. 26, 2000

(30) Foreign Application Priority Data

Jan. 27, 1999 (JP) ............................................ 11-018065

(51) Int. Cl.[7] .............................. H04J 3/06; H04N 5/91
(52) U.S. Cl. ....................................... 370/516; 386/66
(58) Field of Search ................................. 370/402, 419, 370/438, 458, 489, 498, 395.1, 395.61, 395.62, 503–4, 509–14, 516, 520; 710/100, 107–8, 126; 386/66, 71, 84, 85

(56) References Cited

U.S. PATENT DOCUMENTS

| | | | | |
|---|---|---|---|---|
| 5,938,752 A | * | 8/1999 | Leung et al. ................ | 710/106 |
| 6,032,261 A | * | 2/2000 | Hulyalkar .................... | 713/400 |
| 6,118,783 A | * | 9/2000 | Kunito ......................... | 370/399 |
| 6,167,061 A | * | 12/2000 | Nakatsugawa ............... | 370/480 |
| 6,243,395 B1 | * | 6/2001 | Fujimori et al. ............. | 370/466 |
| 6,366,964 B1 | * | 4/2002 | Shima et al. .................. | 710/8 |
| 6,405,247 B1 | * | 6/2002 | Lawande et al. ........... | 709/221 |
| 6,535,926 B1 | * | 3/2003 | Esker ......................... | 709/248 |

OTHER PUBLICATIONS

Onvural, Asynchronous Transfer Mode Networks Performance Issues, second edition, Artech House, PP:45–51.*
Onvural, Asynchronous Transfer Mode Networks Performance Issues, second edition, Artech House, PP:45–51.*

* cited by examiner

*Primary Examiner*—David Vincent
(74) *Attorney, Agent, or Firm*—Frommer Lawrence & Haug LLP; William S. Frommer; Bruno Polito

(57) ABSTRACT

The present invention relates to a data communication system for data communication between a bus and a network. This data communication system of the present invention includes a first interface device for performing interface processing for the bus, a second interface device for performing interface processing for the network, and a generating device for generating a first clock used by the first interface device in synchronization with a second clock used for causing processes in the network to be synchronized.

9 Claims, 12 Drawing Sheets

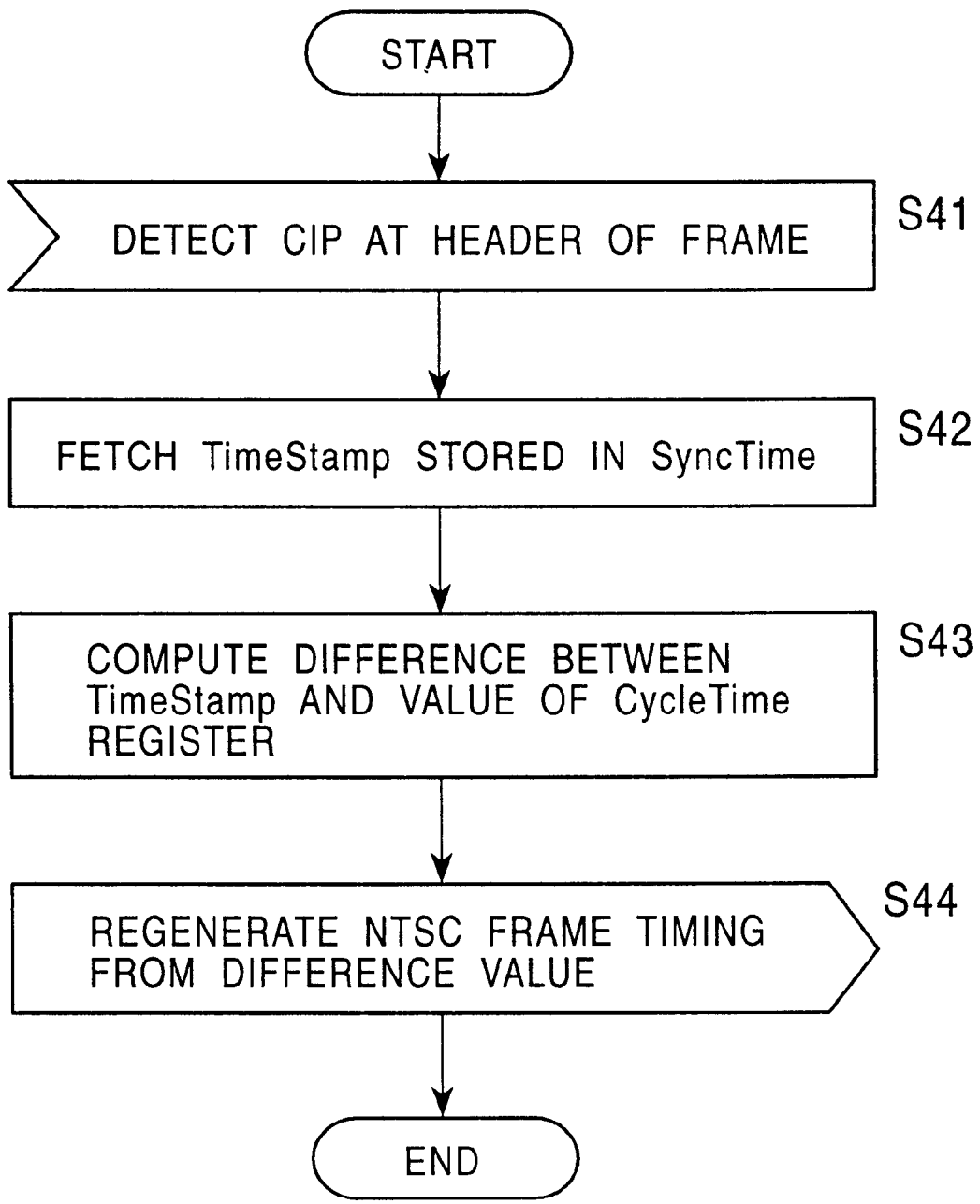

METHOD AND APPARATUS FOR DATA COMMUNICATION AND STORAGE WHEREIN A IEEE1394/FIREWIRE CLOCK IS SYNCHRONIZED TO AN ATM NETWORK CLOCK

BACKGROUND OF THE INVENTION

1. Field of the Invention

The present invention relates to data communication systems and methods, and more particularly relates to a data communication system and method capable of reducing time lag when data is exchanged among various types of buses via networks.

2. Description of the Related Art

FIG. 1 shows an example of the configuration of a conventional network system. In this network system, a digital video cassette recorder (DVCR) 11 is connected to an IEEE1394 ("Institute of Electrical and Electronic Engineers") serial bus (hereinafter simply referred to as a 1394 serial bus) 12. The 1394 serial bus 12 is connected to an asynchronous transfer mode (ATM) network 15 via a User Network Interface (UNI) 14 from an ATM/1394 repeater 13. The ATM network 15 is connected via a UNI 16 to an ATM/1394 repeater 17. The ATM/1394 repeater 17 is connected via a 1394 serial bus 18 to a DVCR 19.

In the 1394 serial bus 12 (as well as the serial bus 18), data is transmitted as shown in FIG. 2. A source packet as shown by (A) in FIG. 2 contains data from the DVCR 11 and is disassembled into data blocks of 480-byte units as shown by (B) in FIG. 2. These data blocks have an isochronous packet header and a common isochronous packet (CIP) header attached thereto which are transmitted in cycles as isochronous packets with a predetermined timing in a period of 125 $\mu$s. A cycle-start packet is transmitted from the cycle master at the start of each cycle. In order to establish synchronization with other devices on the 1394 serial bus 12, every device on the 1394 serial bus 12 has a 32 bit cycle-time register therein. Each device operates, while being synchronized every 125 $\mu$s with the value of the cycle-time register thereof by causing the value of the cycle-time register thereof to be reflected by the value of cycle time data of the cycle-start packet (namely, the value of the cycle-time register of the cycle master) which is synchronized with a reference clock frequency of 24.576 MHz (hereinafter referred to as a "bus reference clock") of the cycle master. Accordingly, the ATM/1394 repeater 13 also operates at a place where interface processing between the 1394 serial bus 12 and the ATM/1394 repeater 13 is required, while being synchronized with the value of the cycle-time register.

The 1394 interface unit of the ATM/1394 repeater 13 performs interface processing on the packet data and an ATM interface unit of the ATM/1394 repeater 13 converts the processed packet data into ATM cells. The ATM cells are transmitted via the UNI 14 to the ATM network 15 which operates, while being synchronized with a reference clock frequency of 8 kHz (hereinafter referred to as an ATM reference clock) so as to be synchronized with every device connected thereto. Therefore, the ATM interface unit of the ATM/1394 repeater 13 performs various types of processing synchronized with the ATM reference clock.

The ATM cells are transmitted via the ATM network 15 and the UNI 16 to the ATM/1394 repeater 17. The input ATM cells are reassembled at an ATM interface unit of the ATM/1394 repeater 17. The reassembled data is transmitted to a 1394 interface unit of the ATM/1394 repeater 17 where the data are formed into packets. Then the packet data is transmitted via the 1394 serial bus 18 to the DVCR 19. The ATM interface unit of the ATM/1394 repeater 17 operates, while being synchronized with the ATM reference clock of the ATM network 15 while the 1394 interface unit of the ATM/1394 repeater 17 operates, while being synchronization of the value of the cycle-time register with that of every device connected to the 1394 serial bus 18.

FIGS. 3 is a theoretical timing chart in a case in which, as described above, the data of the DVCR 11 on the 1394 serial bus 12 is transmitted via the ATM network 15 to the DVCR 19 on the 1394 serial bus 18. When the output data of the DVCR 11 is, for example, NTSC ("National Television System Committee") standard image data, 29.97 Hz frame synchronizing signals are sampled at the 24.576 MHz bus reference clock, for example, at time $t_1$, $t_4$, and $t_7$ (shown by (A) in FIG. 3).

The image data sampled at time $t_1$ is transmitted from the DVCR 11 to the 1394 serial bus 12 by the bus cycle which starts at time $t_2$. At this time, a time stamp is attached to a CIP packet $CIP_1$ (shown by (B) in FIG. 3).

As shown in FIG. 4, an isochronous packet, which is transmitted via the 1394 serial bus 12, includes a 1394 header, a CIPHeader 1, a CIPHeader 2, and data. The CIPHeader 2 contains 16-bit time information SyncTime as the time stamp which is equal to the lower 16 bits of the cycle-time register of any device on the 1394 serial bus 12. The time stamp of the CIP packet $CIP_1$ is obtained by adding the value of an additional delay time TdelayAdd to the value of the cycle-time register at the sampling time (time $t_1$). In other words, the time stamp corresponds to time $t_3$ which is the additional delay time TdelayAdd after time $t_1$. The additional delay time TdelayAdd corresponds to the time for absorbing jitters, such as cycle-timing shift of the 1394 serial bus 12.

When the CIP packet $CIP_1$ is transmitted to the DVR 19 via the 1394 serial bus 18, the DVCR 19 fetches the time stamp contained in the packet (shown by (C) in FIG. 3). Since the time stamp corresponds to time $t_3$, the DVCR 19 generates a frame synchronizing signal for the first frame at time $t_3$. The same processing is sequentially applied to the second frame, the third frame, and so on, one after another.

The timing charts shown in FIG. 3 are theoretical, and an actual timing chart is shown in FIG. 5. That is, the synchronizing signal for the first frame sampled at time $t_1$ is transmitted at time $t_2$ to the 1394 serial bus 12 as the CIP packet $CIP_1$ which includes the time stamp corresponding to time $t_3$ obtained by adding the additional delay time TdelayAdd to the sampling time $t_1$. The CIP packet $CIP_1$ is delayed by a delay time TdelayNet1 which is the total delay time accumulated on each transmission line of the 1394 serial bus 12, the ATM/1394 repeater 13, the UNI 14, the ATM network 15, the UNI 16, ATM/1394 repeater 17, and the 1394 serial bus 18. Finally, the DVCR 19 receives the CIP packet $CIP_1$ at the timing of the bus cycle which starts at time $t_4$. The DVCR 19 fetches the time stamp from the CIP packet $CIP_1$ (shown by (C) in FIG. 5) and generates a synchronizing signal for the first frame at time $t_6$ corresponding to the fetched time stamp (shown by (D) in FIG. 5).

The DVCR 19 connected to the 1394 serial bus 18 on the receiver side times a time ToffsetAddCount1#2 between time $t_4$ and time $t_6$ using the bus reference clock of the 1394 serial bus 18 on the receiver side. Whereas, the DVCR 11 connected to the 1394 serial bus 12 on the sender side sets, as the time stamp of the CIP packet $CIP_1$, time $t_3$ which is a time ToffsetAddCount1#1 after the start time $t_2$ of a bus cycle using the bus reference clock of the 1394 serial bus 12 (shown by (A) in FIG. 5). The time ToffsetAddCount1#1 corresponds to a time difference between time $t_3$ and time $t_2$, in other words, a time difference between time $t_5$ which is a time TdelayNet1 after time $t_3$, and $t_4$ which is the time TdelayNet1 after time $t_2$ (shown by (B) in FIG. 5).

Because the bus reference clock of the 1394 serial bus 12 on the sender side and that of the 1394 serial bus 18 on the receiver side are not synchronized, the cycle of the 1394 serial bus 12 (shown by (B) in FIG. 5) does not exactly correspond to that of the 1394 serial bus 18 (shown by (C) in FIG. 5). Accordingly, a time TsndFrame between time $t_3$ and time $t_9$ as the frame cycle of the 1394 serial bus 12 (shown by (B) in FIG. 5) does not correspond to a time TrevFrame between time $t_6$ and time $t_{13}$ as the frame cycle of the 1394 serial bus 18 (shown by (D) in FIG. 5).

As a result, there is slight difference between the tone of colors of the image on the DVCR 11 and that of the image on the DVCR 19. Furthermore, there is slight difference between the tone of sound on the DVCR 11 and that on the DVCR 19.

Such a bus cycle difference between both sides brings about an overflow or an underflow in the buffer of the ATM/1394 repeater 17 on the receiver side. Whether the overflow or the underflow occurs is determined by a relative relationship between the bus cycles on both sides. When the bus cycle on the sender side is shorter than that on the receiver side, the overflow occurs; and vice versa. The timing chart in FIG. 5 shows the former case where the longer the accumulated delay time gradually becomes, the more the number of the packets staying in the ATM/1394 repeater 17 increases.

For example, when the size of the buffer in the ATM/1394 repeater 17 is 16 Mbytes and when the relative difference is 30 ppm (the standard deviation of a voltage-controlled crystal oscillator to generate clocks), the time which is required for an overflow to occur in the buffer is computed as follows:

A time Tcip for holding one CIP packet in the buffer of 16 Mbytes:

$$Tcip=3072/(24.576\times30)=4.17 \text{ sec; and}$$

a time Tover required for the overflow to occur in the buffer of 16 Mbytes:

$$Tover=Tcip\times16777216/488=143248 \text{ sec}=39.8 \text{ hour}.$$

Therefore, it takes approximately forty hours for an overflow to occur in a buffer of 16 Mbytes.

The time required for an underflow to occur in the buffer is determined by the number of accumulated CIP packets for absorbing jitters and the like. By increasing the number of the accumulated packets, it takes a considerable time for the underflow to occur. However the delay time in the ATM/1394 repeater 17 also increases accordingly. On the contrary, by decreasing the number of accumulated packets, though the delay time is decreased, it does not take much time for the underflow to occur. When, for example, the number of the accumulated CIP packets in the ATM/1394 repeater 17 is 2400 ($125\mu s\times2400=300$ ms, which is the limit of the delay time for real-time applications) and when the relative difference is 30 ppm, the time required for the underflow to occur is computed as follows.

A time Tcip required for one CIP packet to flow out from the ATM/1394 repeater 17:

$$Tcip=3072/(24.576\times30)=4.17 \text{ sec and};$$

a time Tunder required for the accumulated CIP packets to underflow:

$$Tunder=Tcip\times2400=10008 \text{ sec}=2.78 \text{ hour}.$$

Therefore, it takes approximately three hours for the underflow to occur for 2400 accumulated CIP packets.

SUMMARY OF THE INVENTION

The present invention is made to solve the foregoing problems. It is an object of the present invention to provide a device capable of restoring information on the receiver side which corresponds to information on the sender side while an occurrence of an overflow or an underflow is prevented.

To this end, according to a first aspect of the invention, there is provided a data communication system for data communication between a bus and a network, the data communication system includes a first interface device for performing interface processing for the bus, a second interface device for performing interface processing for the network, and a generating device for generating a first clock used by the first interface device as a cycle master clock for the bus in synchronization with a second clock used as a reference clock for an ATM network whereby said first clock is synchronized to the second clock by comparing the phase of the clocks and adjusting the first clock. In the data communication system, the bus may be an IEEE1394 serial bus, and the network is an ATM network. Furthermore, the data communication system may includes a control device for controlling the first interface device and the second interface device, and a frequency-dividing device generating an interrupt control signal provided to the control device by performing frequency-division on the second clock.

According to a second aspect of the invention, there is provided a data communication method for data communication between a bus and a network, the data communication method includes a first interfacing step for performing interface processing for the bus, a second interfacing step for performing interface processing for the network, and a generating step for generating a first clock used by the first interfacing step as a cycle master clock for the bus in synchronization with a second clock used as a reference clock for an ATM network whereby said first clock is synchronized to the second clock by comparing the phase of the clocks and adjusting the first clock.

Other and further aspects of the present invention will become apparent during the course of the following description and by reference to the accompanying drawings.

BRIEF DESCRIPTION OF THE DRAWINGS

FIG. 12 is a flowchart of operations of a DVCR 19 in FIG. 6.

DESCRIPTION OF THE PREFERRED EMBODIMENTS

Figure 1:
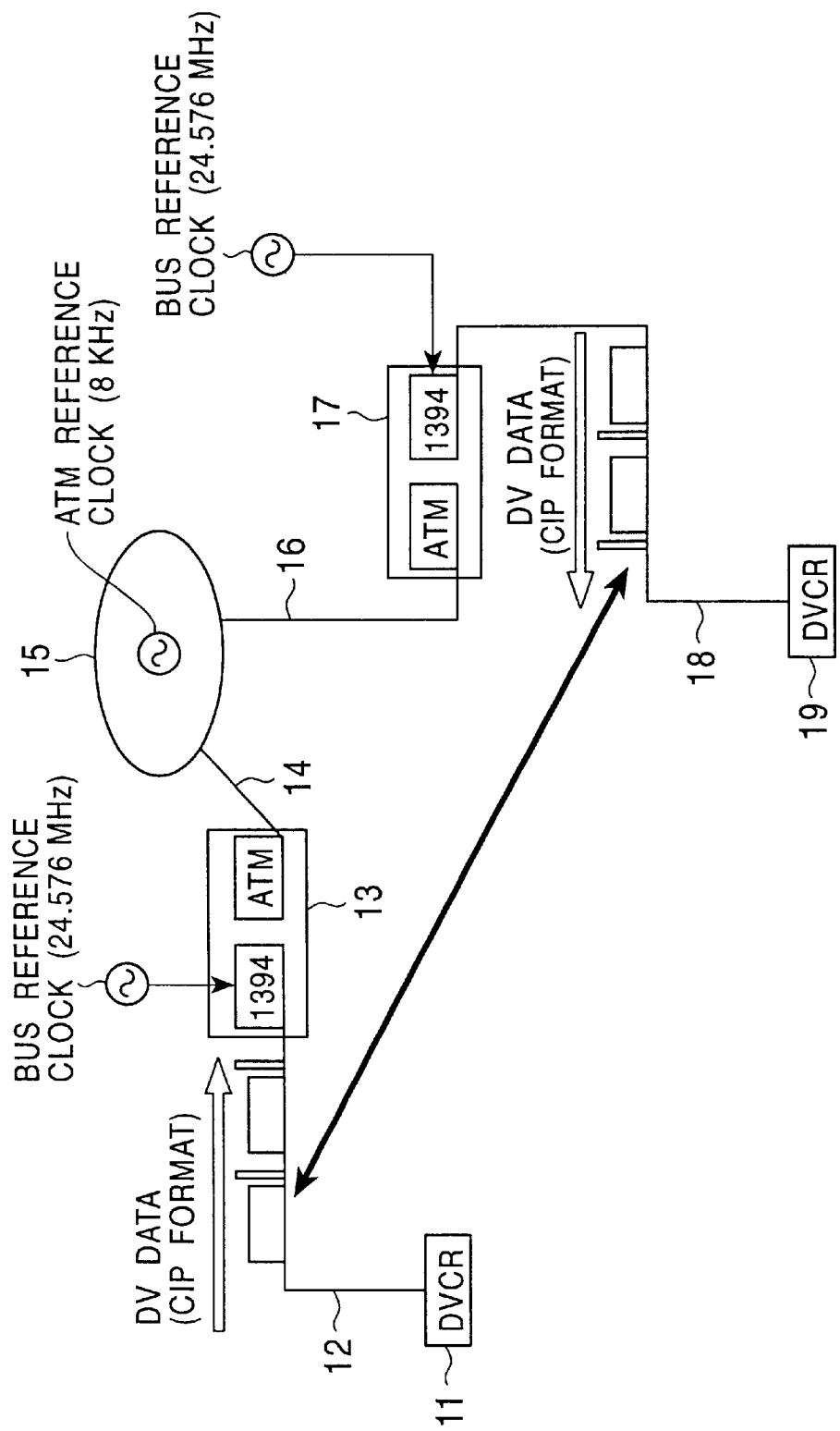
FIG. 1 is a block diagram of the configuration of a conventional network system.
Figure 2:
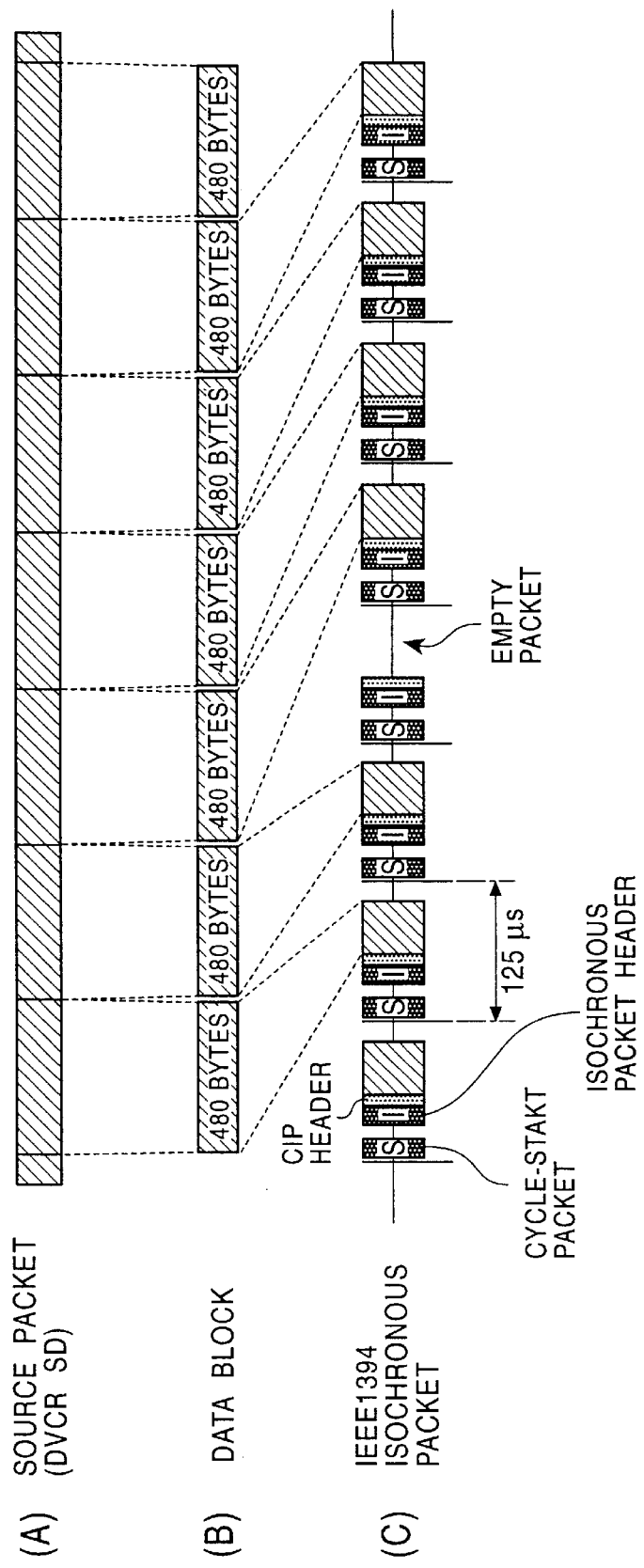
FIG. 2 is a diagram illustrating the transmission of isochronous packets in a 1394 serial bus.
Figure 3:
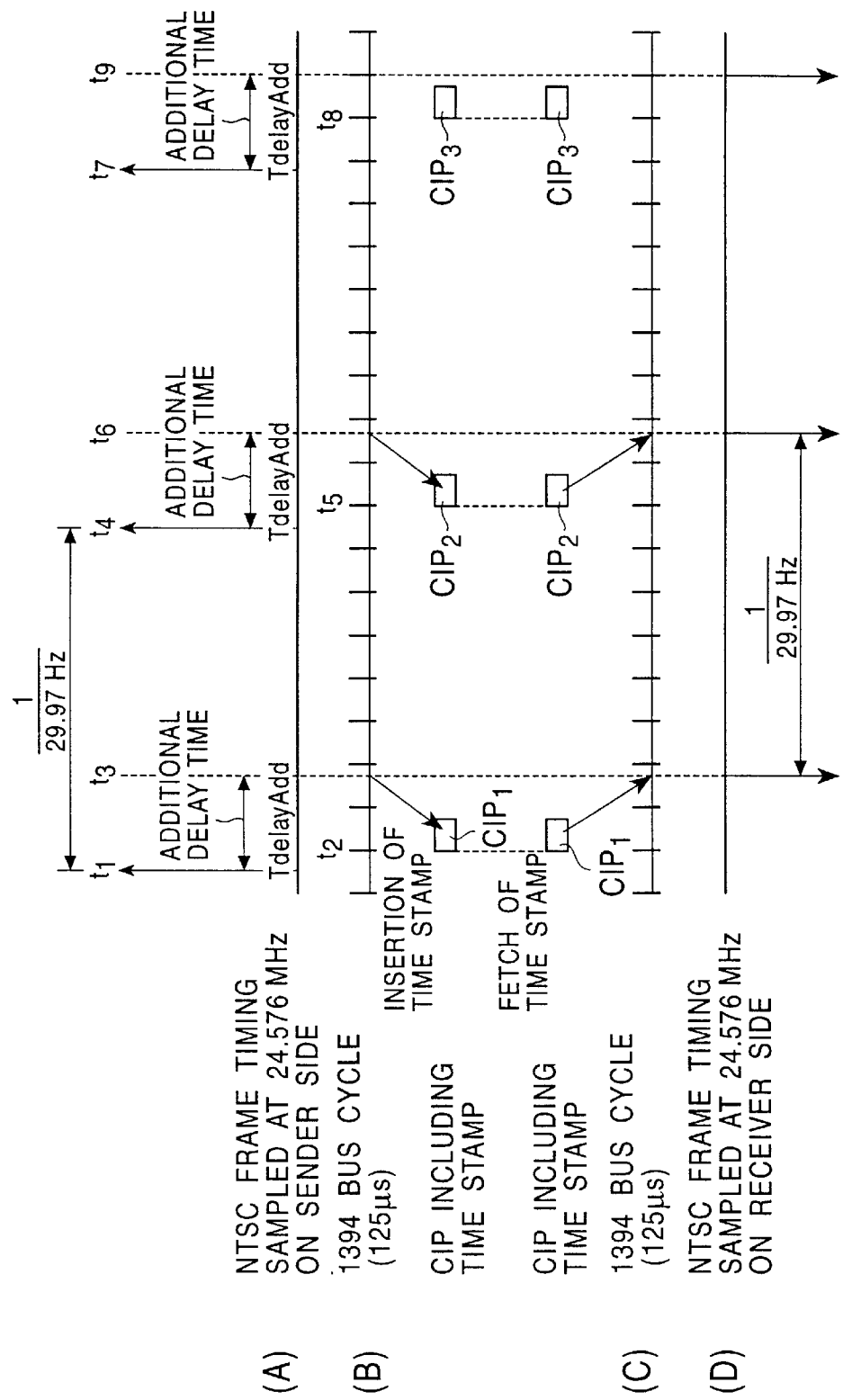
FIG. 3 is a timing chart illustrating operational principles of the network system in FIG. 1.
Figure 6:
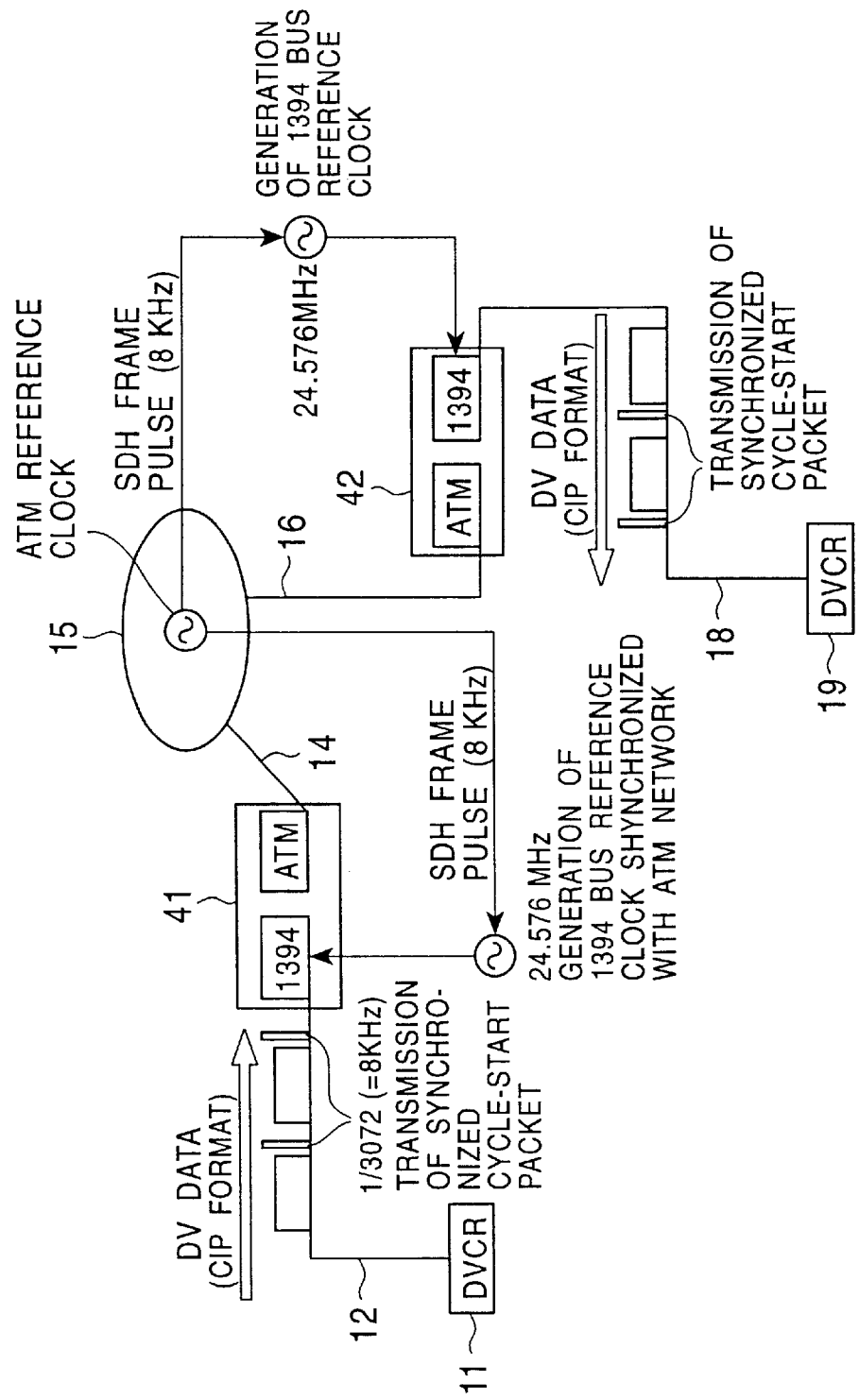
FIG. 6 is the configuration of a network system according to the present invention.

FIG. 6 shows one example of a configuration of a network system according to the present invention. When a component in FIG. 6 is equivalent to the corresponding one in FIG. 1, the component has the same reference numeral as the corresponding one and the description thereof is omitted. The basic configuration of the system is the same as shown in FIG. 1. A difference between the configuration in FIG. 6 and that in FIG. 1 is the configuration of an ATM/1394 repeater 41 provided between a 1394 serial bus 12 and an ATM network 15, and the configuration of an ATM/1394 repeater 42 provided between the ATM network 15 and a 1394 serial bus 18. In the configuration in FIG. 6, the ATM/1394 repeater 41 is the cycle master of the 1394 serial bus 12 and the ATM/1394 repeater 42 is the cycle master of the 1394 serial bus 18. Bus reference clocks of frequency 24.576 MHz employed by the 1394 serial buses 12 and 18 are generated to synchronize with the 8 kHz ATM reference clock (SDH (Synchronous Digital Hierarchy) Frame Pulse) employed by the ATM network 15.

Figure 7:
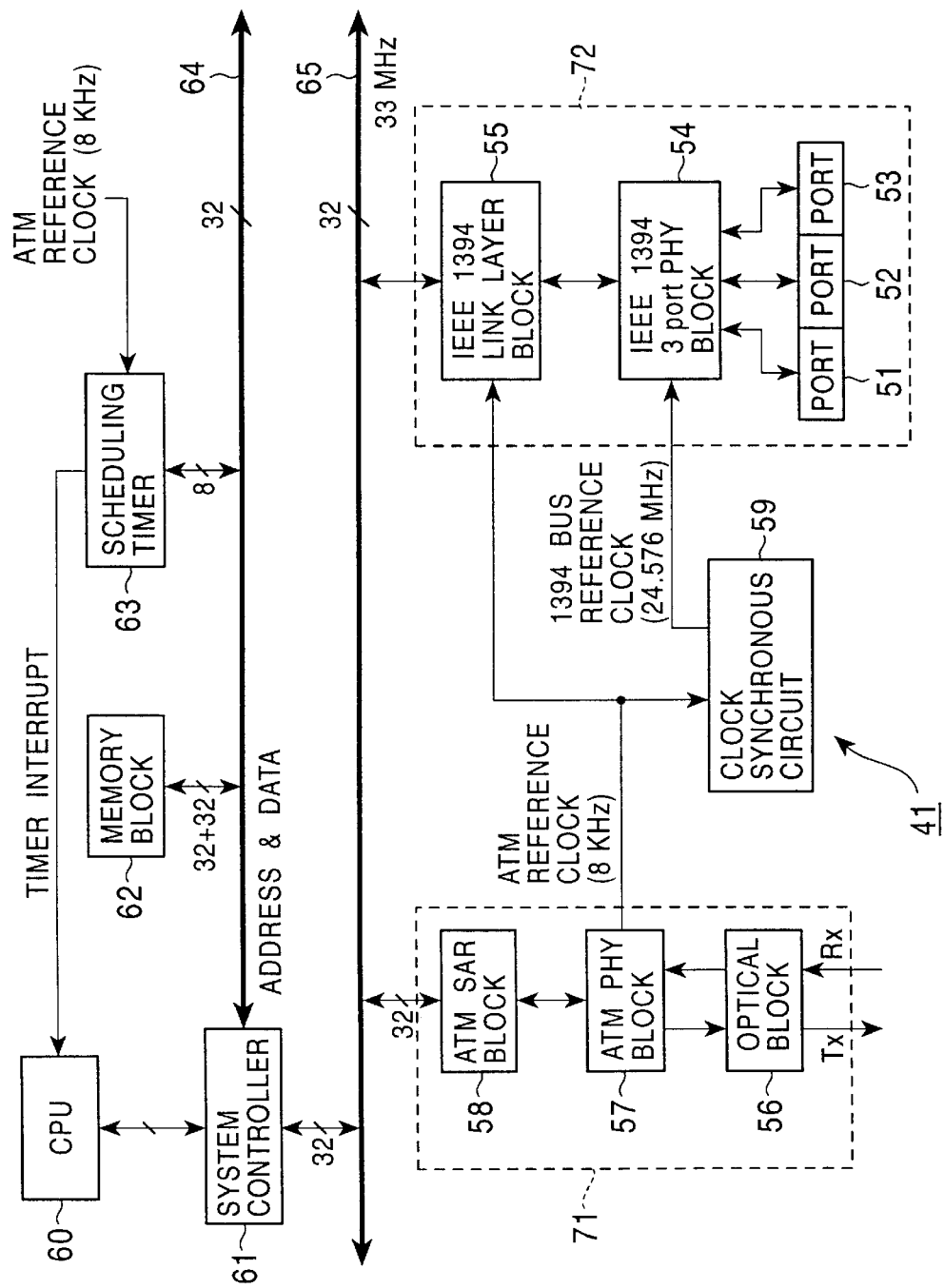
FIG. 7 is a block diagram of the configuration of an ATM/1394 repeater 41 in FIG. 6.

FIG. 7 shows a configuration of the ATM/1394 repeater 41. The configuration of the ATM/1394 repeater 42 is the same as that of the ATM/1394 repeater 41.

A central processing unit (CPU) 60 controls ATM SAR (segmentation and reassembly) block 58, an ATM PHY (Physical Layer) block 57, an IEEE1394 LINK layer block 55, an IEEE1394 three-port PHY block 54, and a system controller 61 using programs, thereby performing interface processing.

A scheduling timer 63 is set to issue timer interrupt signal to the CPU 60 by performing frequency-division on the 8 kHz ATM reference clock (ATM/SDH frame timing). A memory block 62, where packet data to be exchanged are stored, is connected via a local bus 64 to the system controller 61. The system controller 61 is connected via a PCI bus (Peripheral Component Interconnect) 65 to a block 71 and a block 72. The block 71 performs transmitting/receiving processing for the ATM network 15 and includes the ATM SAR block 58, the ATM PHY block 57, and an optical block 56. The block 72 performs transmitting/receiving processing for the 1394 serial bus 12 and includes the IEEE1394 LINK layer block 55 and the IEEE1394 three-port PHY block 54.

The ATM SAR block 58 disassembles data transmitted via the system controller 61 and the PCI bus 65 from the memory block 62 into ATM cells and transmits the ATM cells to the ATM PHY block 57. Also, the ATM SAR block 58 reassembles ATM cells from the ATM PHY block 57 and transmits the reassembled ATM cells via the system controller 61 and the PCI bus 65 to the memory block 62. The ATM PHY block 57 converts ATM cells from the ATM SAR block 58 in accordance with the specification of the optical block 56 and transmits the converted ATM cells to the optical block 56. Also, the ATM PHY block 57 fetches ATM cells to be transmitted to the ATM SAR block 58 from data from the optical block 56 and transmits the ATM cells to the ATM SAR block 58. The optical block 56 receives data transmitted by optical signals from the ATM network 15, and converts the optical signals into electrical signals, then transmits the electrical signals to the ATM PHY block 57. Also, the optical block 56 converts data from the ATM PHY block 57 into optical signals and transmits the optical signals to the ATM network 15.

The IEEE1394 LINK layer block 55 receives ATM format data which is input from the memory block 62 via the system controller 61 and the PCI bus 65, causes the CPU 60 to convert the data in accordance with a predetermined 1394 serial bus format, and transmits the converted data to the IEEE1394 three-port PHY block 54. Also, the IEEE1394 LINK layer block 55 receives 1394 serial bus format data which is input from the IEEE1394 three-port PHY block 54, transmits the data via the system controller 61 and the PCI bus 65 to the memory block 62, and causes the CPU 60 to convert the 1394 serial bus format data into ATM format data. The IEEE1394 three-port PHY block 54 converts input data from the IEEE1394 LINK layer block 55 into an 1394 serial bus signal and transmits the signal to the 1394 serial bus 12 via one of ports 51 to 53. Also, the IEEE1394 three-port PHY block 54 receives input data from the 1394 serial bus 12 via one of the ports 51 to 53 and transmits the data to the IEEE1394 LINK layer block 55.

The ATM PHY block 57 fetches the ATM reference clock of frequency 8 kHz and transmits it to a clock synchronous circuit 59 and the IEEE1394 LINK layer block 55. The ATM reference clock is globally synchronized in the ATM network 15. By synchronizing with the input ATM reference clocks, the IEEE1394 LINK layer block 55 detects transmission timing of a cycle-start packet in the 1394 serial bus 12. By synchronizing with the input ATM reference clocks, the clock synchronous circuit 59 generates a 24.576 MHz bus reference clock for the 1394 serial bus 12 and transmits it to the IEEE1394 three-port PHY block 54.

Figure 8:
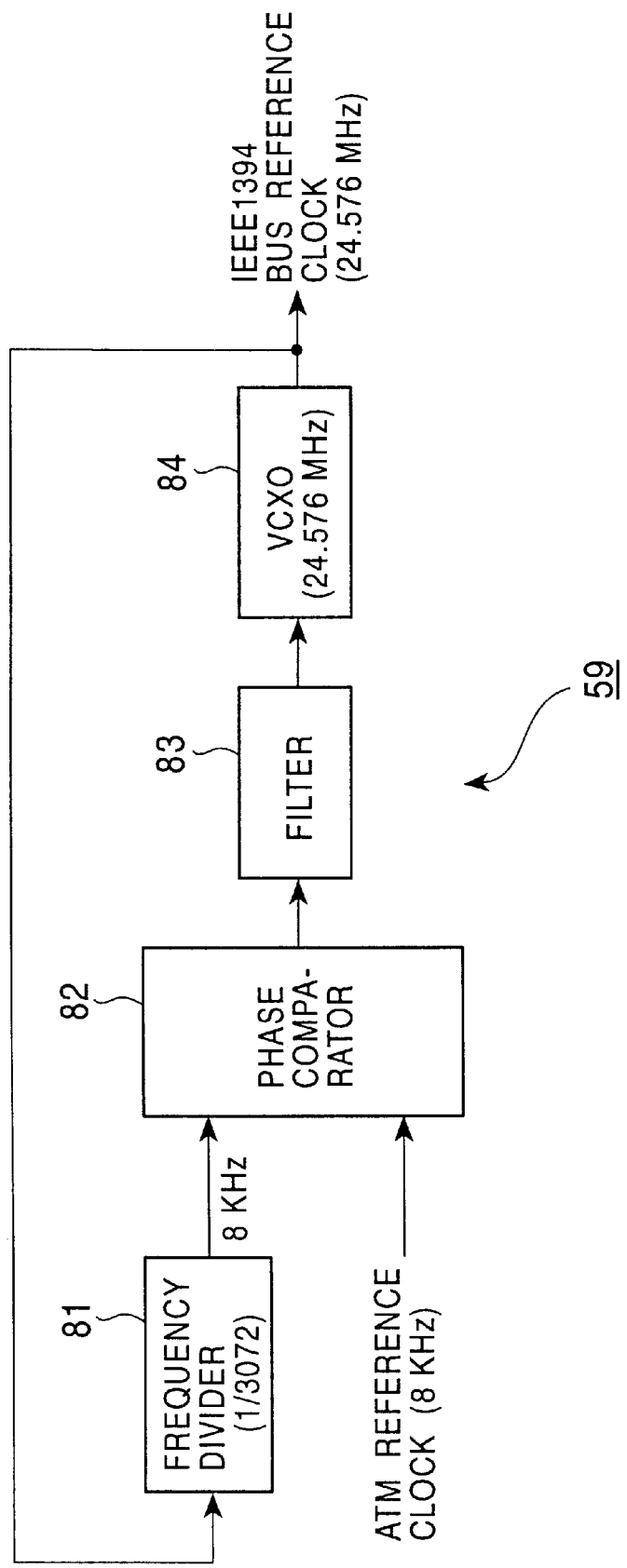
FIG. 8 is a block diagram of the configuration of a clock synchronous circuit 59 in FIG. 7.

FIG. 8 shows the configuration of the clock synchronous circuit 59. That is, the clock synchronous circuit 59 is constructed as a phase-locked loop (PLL) circuit where a phase comparator 82 performing phase-comparison between an 8 kHz input ATM reference clock from the ATM PHY block 57 and an 8 kHz input clock from a frequency divider 81 and the resultant phase error signal is transmitted to a filter (low-pass filter) 83 which filters the input phase error signal and transmits it to a voltage-controlled crystal oscillator circuit (VCXO) 84. The voltage-controlled crystal oscillator circuit 84 is set so that the standard oscillating frequency thereof is 24.576 MHz, generates a clock whose phase corresponds to the control signal (control voltage) input from the filter 83, and then transmits it as a bus reference clock to the IEEE 1384 three-port PHY block 54. The voltage-controlled crystal oscillator circuit 84 transmits a bus reference clock to the frequency divider 81 which divides the bus reference clock by 3072 and transmits it to the phase comparator 82.

Thus, the clock synchronous circuit 59 generates a 24.576 MHz bus reference clock for the 1394 serial bus 12 synchronized with an 8 kHz ATM reference clock for the ATM network 15 from the ATM PHY block 57 and transmits it.

Operations of transmission of digital video (DV) data from DVCR 11 (connected to the 1394 serial bus 12 on the sender side) to the DVCR 19 (connected to the 1394 serial bus 18 on the receiver side) are described with reference to FIGS. 9 to 12. Initially, Operations of the DVCR 11 on the sender side are described with reference to the flowchart in FIG. 9. In the DVCR 11, NTSC standard video signals are sampled and output.

Figure 4:
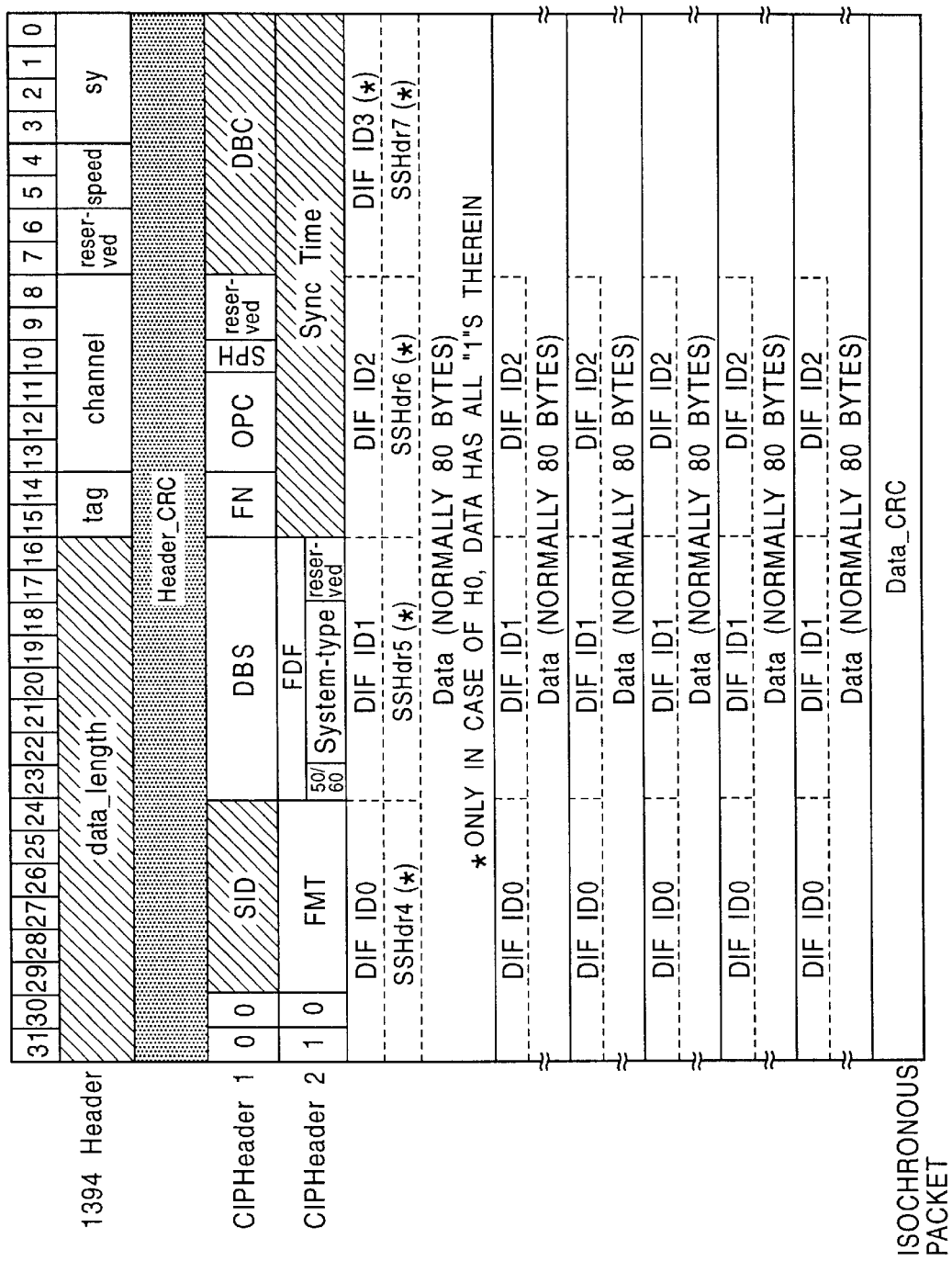
FIG. 4 is a diagram showing the configuration of an isochronous packet.
Figure 5:
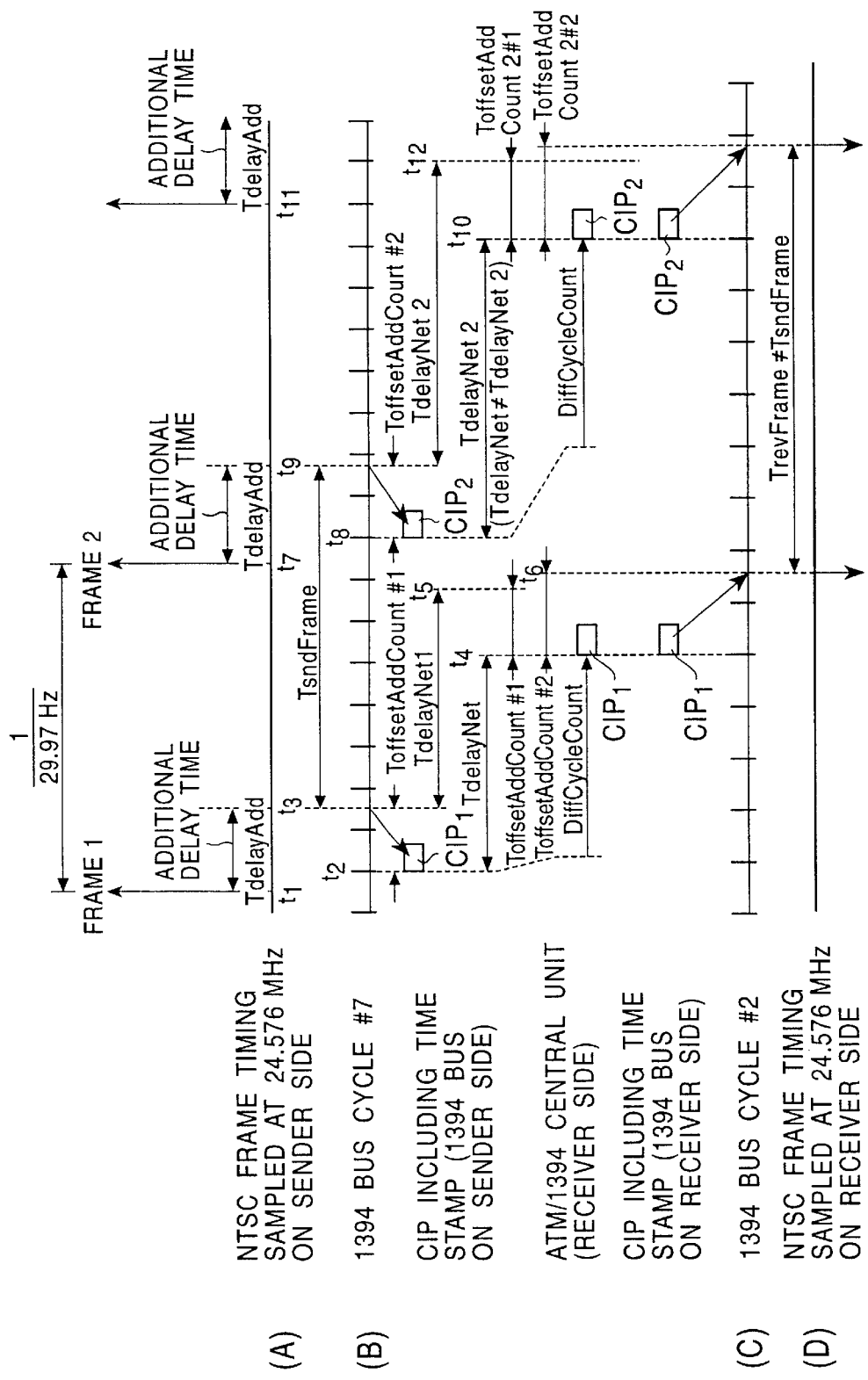
FIG. 5 is a timing chart illustrating operations of the conventional network system in FIG. 1.
Figure 10:
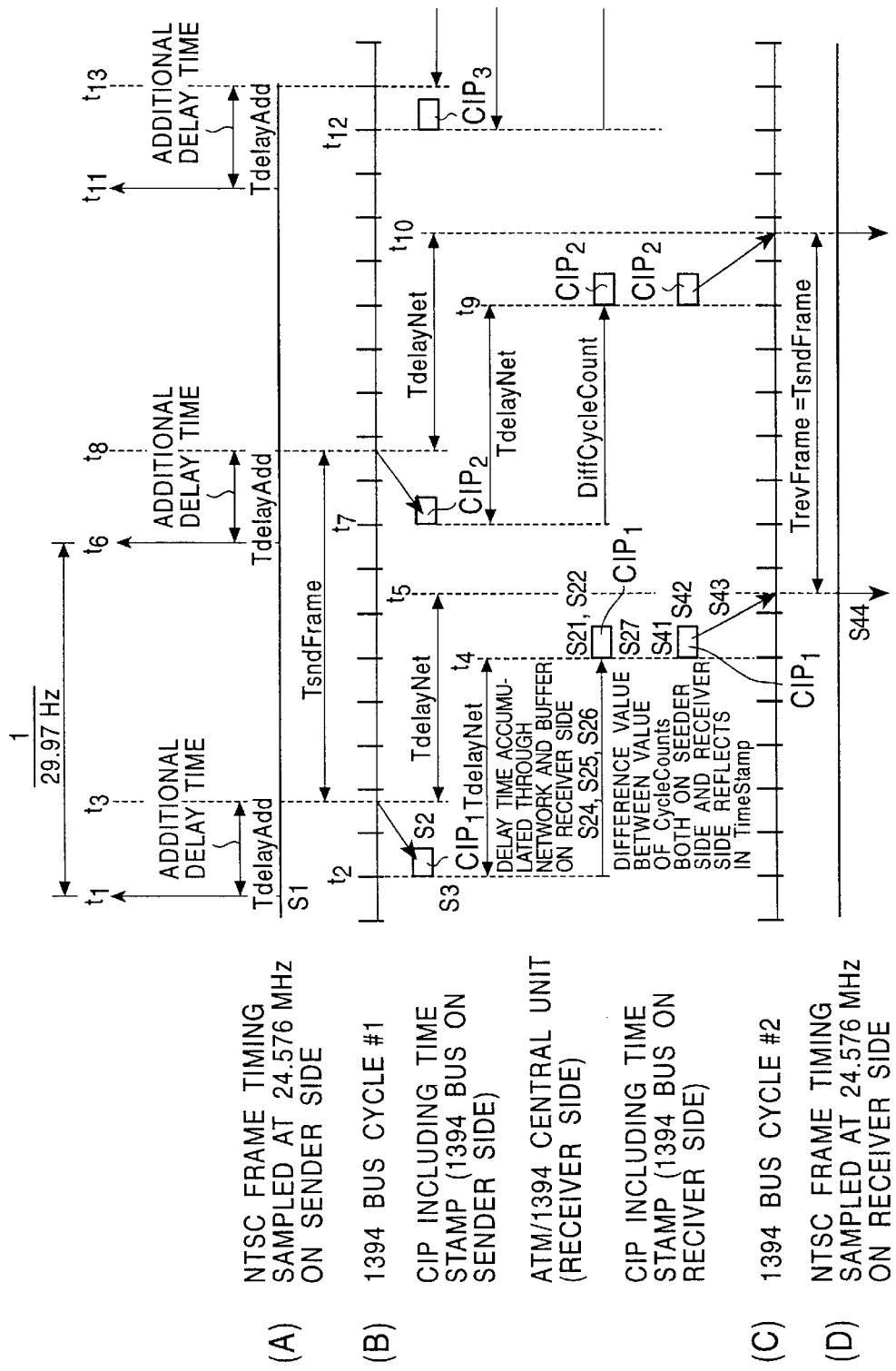
FIG. 10 is a timing chart illustrating operations of the network system in FIG. 6.

At step S1, the DVCR 11 samples a 29.97 Hz frame synchronizing signal based on a clock frequency of 24.576 MHz at time $t_1$ (FIG. 10A). Since the ATM/1394 repeater 41 is the cycle master of the 1394 serial bus 12, the DVCR 11 connected to the 1394 serial bus 12 reflects the value of the cycle-time register thereof in cycle time data of a cycle-start packet generated by the ATM/1394 repeater 41. The cycle time data is equal to the value of the cycle-time register of the cycle master, i.e., the ATM/1394 repeater 41, and is counted up by the bus reference clock from the synchronous circuit 59. Because of this, the value of the cycle-time register of the DVCR 11 is synchronized with the value of the cycle-time register of the ATM/1394 repeater 41 every 125 μsec. At step S2, the value which is obtained by adding the additional delay time TdelayAdd to the current (time $t_1$) value of the lower 16 bits of the cycle-time register is stored in the SyncTime field of the CIP header of the CIP packet (FIG. 4) which conveys the frame synchronizing signal of the first frame. At step S3, the DVCR 11 transmits CIP packet $CIP_1$ as an isochronous packet to the 1394 serial bus 12 with the timing of the bus cycle which starts from time $t_2$ (shown by (B) in FIG. 10).

In the same manner as the case described in the related art, the time stamp included in the CIP packet $CIP_1$ corresponds to time $t_3$ which is obtained by adding the additional delay time TdelayAdd to time $t_1$.

The DVCR 11 transmits the data via the 1394 serial bus to the ATM/1394 repeater 41 where predetermined interface-processing is performed on this data which is input from the IEEE1394 three-port PHY block 54 via, for example, the port 51. Since this processing is performed based on the bus reference clock synchronized with the ATM reference clock from the clock synchronous circuit 59, it is phase-synchronized with processing in the ATM network 15. The IEEE1394 LINK layer block 55 processes the data from the IEEE1394 three-port PHY block 54 based on transmission timing of a cycle-start packet generated with a timing synchronized with the input ATM reference clock from the ATM PHY block 57, and transmits the processed data to the PCI bus 65. The system controller 61 transmits the input data from the PCI bus 65 to the memory block 62 via the local bus 64 and causes the memory block 62 to store the data.

The CPU 60 reads the data stored in the memory block 62 using the system controller 61 and transmits the data to the ATM SAR block 58. The ATM SAR block 58 disassembles the data transmitted from the memory block 58 into ATM cells and transmits the ATM cells to the ATM PHY block 57. The ATM PHY block 57 converts the ATM cells into an appropriately formatted data for use with the optical block 56, and transmits the data to the optical block 56 where the input data is transmitted via the UNI 14 to the ATM network 15.

Figure 11:
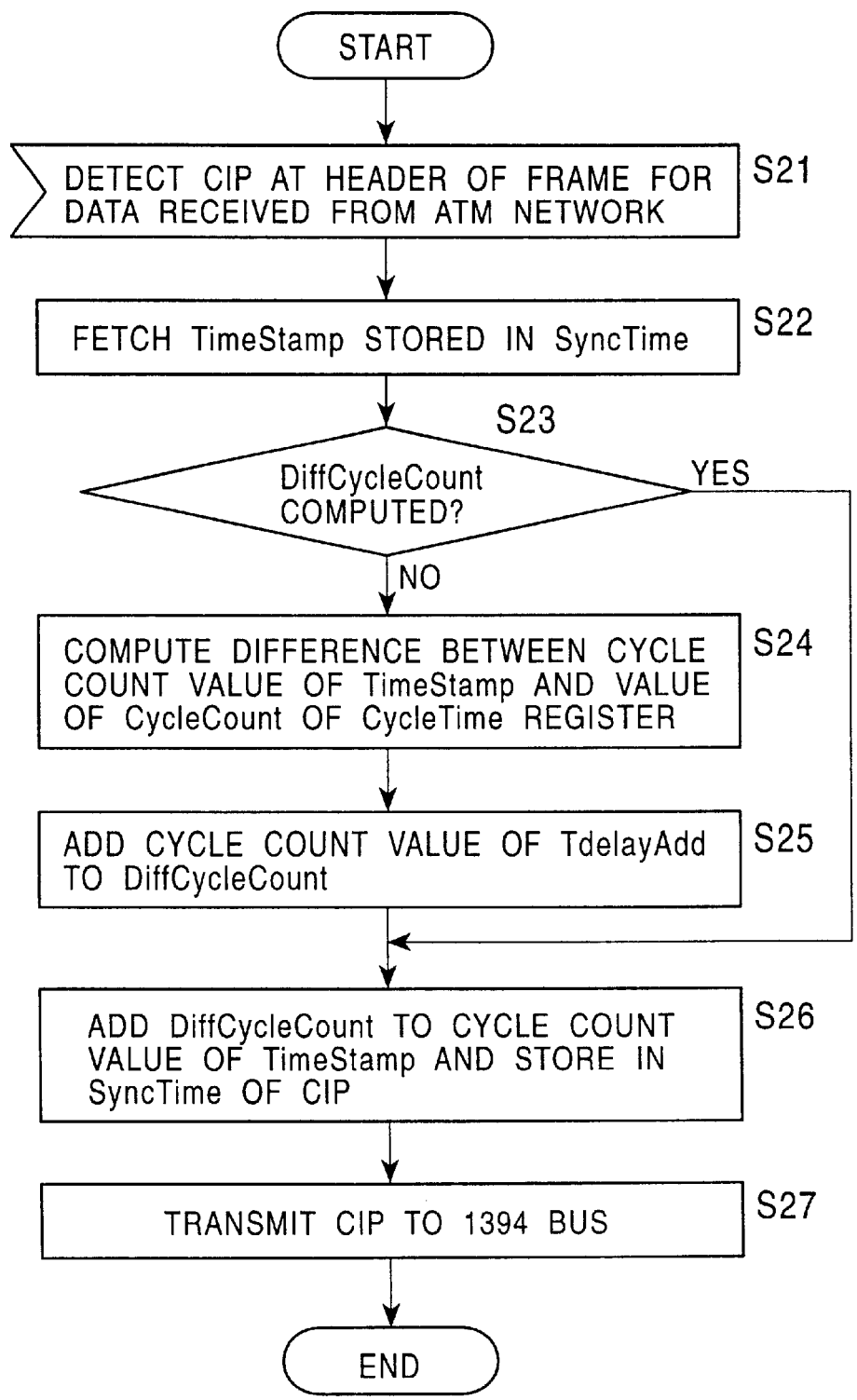
FIG. 11 is a flowchart illustrating operations of an ATM/1394 repeater 42 in FIG. 6.

The ATM/1394 repeater 42 receives the data from the ATM network 15 via the UNI 16. As shown by (B) in FIG. 10, the DVCR 11 transmits the data at time $t_2$, and the ATM/1394 repeater 42 receives the data at time $t_4$, which is a delay time TdelayNet after time $t_2$. When the ATM/1394 repeater 42 receives the data, operations shown in the flowchart in FIG. 11 are performed. Operations of the ATM/1394 repeater 42 are described using the configuration shown in FIG. 7.

At step S21, the CPU 60 of the ATM/1394 repeater 42 performs a detecting operation for detecting a CIP at the header of a frame contained in data received from the ATM network 15. That is, ATM cell signals are input to the ATM/1394 repeater 42; the ATM cells are converted from an optical signal to an electrical signal at the optical block 56; the ATM PHY block 57 fetches the ATM cells from the input data; the ATM SAR block 58 reassembles ATM cells and transmits the ATM cells to the system controller 61 via the PCI bus 65; the system controller 61 transmits the input data to the memory block 62 via the local bus 64 and causes the memory block 62 to store the data; and the CPU 60 reads the data stored in the memory block 62 using the system controller 61 and detects the CIP at the header of a frame from the data.

At step S22, the CPU 60 fetches time stamp information stored in the SyncTime field of the CIP. At step S23, the CPU 60 determines whether or not a difference value DiffCycleCount, which is the difference between the value of the bus cycle (a cycle) of the 1394 serial bus 12 on the sender side and the value of the bus cycle of the 1394 serial bus 18 on the receiver side, is already computed. When the difference value DiffCycleCount is not computed, the process proceeds to step S24. At step S24, the CPU 60 computes a difference between the cycle count value (the upper four bits) of the time stamp obtained at step S22 and a value CycleCount of the cycle-time register at the time when the CIP packet $CIP_1$ is transmitted to the 1394 serial bus 18. At step S25, the CPU 60 obtains the difference value DiffCycleCount by adding the cycle count value of the additional delay time TdelayAdd to the difference value obtained at step S24.

At step S23, when the CPU 60 determines that the difference value DiffCycleCount is already computed, the process proceeds to step S26.

At step S26, the CPU 60 adds the value of the cycle count (the upper four bits) of the time stamp to the difference value DiffCycleCount obtained at step S25 and the resultant value of the computation is stored as a new time stamp in the SyncTime field of the CIP packet $CIP_1$. At step S27, the CIP packet $CIP_1$ generated at step S26 is transmitted to the 1394 serial bus 18.

That is, the CPU 60 causes the system controller 61 to transmit the CIP packet $CIP_1$ to the IEEE1394 LINK layer block 55 via the PCI bus 65; the IEEE1394 LINK layer block 55 causes the CPU 60 to convert the input ATM format data into a predetermined 1394 serial bus format data and the converted data is transmitted to the IEEE1394 three-port block 54; and the IEEE1394 three-port block 54 converts the input data from the IEEE1394 LINK layer block 55 into an IEEE1394 serial bus signal and transmits the signal to the 1394 serial bus 18 via, for example, the port 51. Finally, this isochronous packet is transmitted to the DVCR 19.

Operations of the DVCR 19 are described with reference to the flowchart in FIG. 12 when the CIP packet $CIP_1$ is received as the isochronous packet via the 1394 serial bus 18.

Initially, at step S41, the DVCR 19 performs a detecting operation for detecting the CIP at the header of a frame. In this case, the CIP packet $CIP_1$ is detected. At step S42, the time stamp stored in the SyncTime field of the CIP packet $CIP_1$ is fetched. Additionally, only the SyncTime field at the header of a frame of the CIP packet has a valid value.

At step S43, the difference value between the value of the time stamp fetched at step S42 and the value (the lower 16 bits) of the cycle-time register at a time when the CIP packet $CIP_1$ is received is computed. The computed time corresponds to a time difference between time $t_4$ and time $t_5$ (the output timing of the frame synchronizing signal of the first frame) (shown by (C) in FIG. 10). At step S44, the DVCR 19 regenerates the frame synchronizing signal of the first frame with a timing based on the time difference obtained at step S43 (shown by (D) in FIG. 10).

Figure 9:
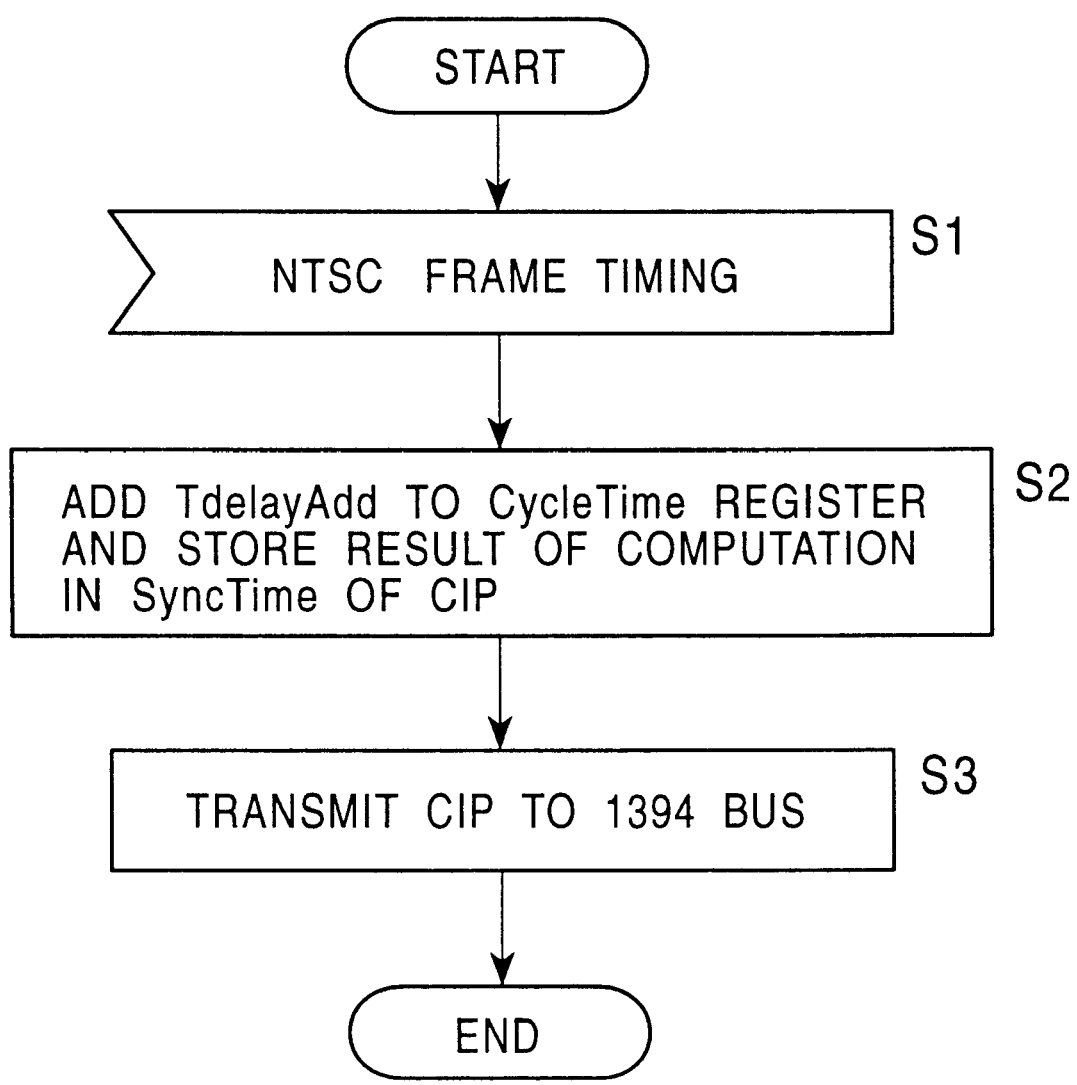
FIG. 9 is a flowchart illustrating operations of a DVCR 11 in FIG. 6.

FIG. 10 shows an executing timing of each step in FIGS. 9, 11, and 12 using the corresponding step numbers.

As described above, since the present invention enables the 1394 serial bus 12 on the sender side and the 1394 serial bus 18 on the receiver side to be synchronized, the total delay time TdelayNet on transmission lines from the 1394 serial bus 12 on the sender side to the 1394 serial bus 18 on the receiver side can be always maintained constant. Accordingly, the number of packets held in the buffer (the memory block 62 in FIG. 7) of the ATM/1394 repeater 42 is substantially constant, which prevents the underflow or the overflow of the buffer from occurring.

Furthermore, the frame cycle TsndFrame on the sender side (shown by (A) in FIG. 10) and the frame cycle TrevFrame on the receiver side (shown by (D) in FIG. 10) correspond because the difference value DiffCycleCount between the cycle count value on the sender side (the DVCR 11) and the value Cycle Count on the receiver side (the ATM/1394 repeater 42) is computed so as to reflect the time stamp, as is described using the flowchart in FIG. 11. Therefore, slight differences between tones of colors or tones of sound on both sides are prevented.

Since the cycle-time register is provided in a Link Chip (corresponds to the block 72 of the ATM/1394 repeater 41 in FIG. 7) of a device which is connected to a 1394 serial bus, the value DiffCycleCount can be securely computed.

By transmitting to the CPU 60, as a software interrupt signal, a scheduling signal generated by causing the scheduling timer 63 to properly divide the ATM reference clock of the ATM network 15, software implementation of processing in the ATM/1394 repeater 41 or the ATM/1394 repeater 42 can also guarantee the strict time base. For example, in a case in which the 8 kHz ATM reference clock is divided by 16 so that an interrupt processing routine can be performed every 2 ms, since a software program can recognize that the number of CIP packets to be transmitted during 2 ms is 16 packets for an isochronous channel and since the time base is based on the bus reference clock which is synchronized with all 1394 serial buses in the system, the software program can also strictly guarantee the time base.

A transmission method of CIP packets in the ATM network 15 may be any method as long as the method enables a buffer of the ATM/1394 repeater on the receiver side to absorb jitters caused by the transmission of packets.

In this embodiment, the 1394 serial bus and the ATM network are employed as a bus and a network, respectively. Other buses and networks may be employed.

In this specification, the system refers to the entire unit including a plurality of devices.

As a medium providing an end user with a computer program which performs the above-described processes, a storage medium, such as a magnetic disk, a CD-ROM, and a semiconductor memory, as well as a communication medium such as a network and a satellite, may be used.

What is claimed is:

1. A data communication system for data communication between a serial bus and an ATM (Asynchronous Transfer Mode) network, the data communication system comprising:

first interface means for performing interface processing for said bus;

second interface means for performing interface processing for said network; and generating means for generating a first clock used by said first interface means as a cycle master clock for said bus in synchronization with a second clock used as a reference clock for said ATM network;

whereby said first clock is generated by a phase locked loop wherein the phase of a frequency-divided version of said first clock is compared to the phase of said second clock and the frequency of said first clock is adjusted according to the result of the phase comparison.

2. A data communication system according to claim 1, wherein:

said bus is an IEEE1394 serial bus.

3. A data communication system according to claim 1, further comprising:

control means for controlling said first interface means and said second interface means; and frequency-dividing means for generating an interrupt control signal provided to said control means by performing frequency-division on said second clock.

4. A data communication method for data communication between a serial bus and an ATM (Asynchronous Transfer Mode network, the data communication method comprising:

a first interfacing step for performing interface processing for said bus;

a second interfacing step for performing interface processing for said network; and a generating step for generating a first clock used by said first interfacing step as a cycle master clock for said bus in synchronization with a second clock used as a reference clock for said ATM network;

whereby said first clock is generated by a phase locked loop wherein the phase of a frequency-divided version of said first clock is compared to the phase of said second clock and the frequency of said first clock is adjusted according to the result of the phase comparison.

5. A data communication system for data communication between a serial bus and an ATM (Asynchronous Transfer Mode) network, the data communication system comprising:

first interface means for performing interface processing for said serial bus;

second interface means for performing interface processing for said network; and generating means for generating a first clock used by said first interface means as a cycle master clock for said bus in synchronization with a second clock used as a reference clock for said ATM network;

whereby said first clock is generated by a phase locked loop wherein the phase of a frequency-divided version of said first clock is compared to the phase of said second clock and the frequency of said first clock is adjusted according to the result of the phase comparison; and whereby the frequency of said first clock is based on a frame timing signal used by said network.

6. A data communication method for data communication between a serial bus and an ATM (Asynchronous Transfer Mode) network, the data communication method comprising:

a first interfacing step for performing interface processing for said serial bus;

a second interfacing step for performing interface processing for said network; and a generating step for generating a first clock used by said first interfacing step as a cycle master clock for said bus in synchronization with a second clock used as a reference clock for said ATM network;

whereby said first clock is generated by a phase locked loop wherein the phase of a frequency-divided version of said first clock is compared to the phase of said second clock and the frequency of said first clock is adjusted according to the result of the phase comparison; and whereby the frequency of said first clock is based on a frame timing signal used by said network.

7. A data communication system for transmitting data from a transmitting unit to a receiving unit via a first serial bus, an ATM (Asynchronous Transfer Mode) network, and a second serial bus, the data communication system comprising:

first interface means for performing interface processing for said first serial bus;

second interface means for performing interface processing for said network;

third interface means for performing interface processing for said second serial bus; and generating means for generating a first clock used by said third interface means as a cycle master clock for said second bus in synchronization with a second clock used by said second interface means as a reference clock for said ATM network, whereby said first clock is generated by a phase locked loop wherein the phase of a frequency-divided version of said first clock is compared to the phase of said second clock and the frequency of said first clock is adjusted according to the result of the phase comparison; and whereby a reference clock of said first serial bus and said first clock are synchronized.

8. A data communication method for transmitting data from a transmitting unit to a receiving unit via a first serial bus, an ATM (Asynchronous Transfer Mode) network, and a second serial bus, the data communication method comprising:

a first interfacing step for performing interface processing for said first serial bus;

a second interfacing step for performing interface processing for said network;

a third interfacing step for performing interface processing for said second serial bus; and a generating step for generating a first clock used by said third interface means as a cycle master clock for said second bus in synchronization with a second clock used by said second interface means as a reference clock for said ATM network, whereby said first clock is generated by a phase locked loop wherein the phase of a frequency-divided version of said first clock is compared to the phase of said second clock and the frequency of said first clock is adjusted according to the result of the phase comparison; and whereby a reference clock of said first serial bus and said first clock are synchronized.

9. A computer-readable storage medium containing a program to perform processing by a data communication method for data communication between a serial bus and an ATM (Asynchronous Transfer Mode network, the data communication method comprising:

a first interfacing step for performing interface processing for said bus;

a second interfacing step for performing interface processing for said network; and a generating step for generating a first clock used by said first interfacing step as a cycle master clock for said bus in synchronization with a second clock used as a reference clock for said ATM network;

whereby said first clock is generated by a phase locked loop wherein the phase of a frequency-divided version of said first clock is compared to the phase of said second clock and the frequency of said first clock is adjusted according to the result of the phase comparison.

* * * * *